US010903545B2

(12) United States Patent
Popovich et al.

(10) Patent No.: US 10,903,545 B2
(45) Date of Patent: *Jan. 26, 2021

(54) METHOD OF MAKING A MECHANICALLY STABILIZED RADIO FREQUENCY TRANSMISSION LINE DEVICE (71) Applicant: 3D GLASS SOLUTIONS, INC., Albuquerque, NM (US)

(72) Inventors: Mark Popovich, Coto de Caza, CA (US); Jeb H. Flemming, Albuquerque, NM (US); Jeff A. Bullington, Orlando, FL (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/631,700

(22) PCT Filed: May 29, 2019

(86) PCT No.: PCT/US2019/034245
§ 371 (c)(1),
(2) Date: Jan. 16, 2020

(87) PCT Pub. No.: WO2019/231947
PCT Pub. Date: Dec. 5, 2019

(65) Prior Publication Data
US 2020/0168976 A1 May 28, 2020

Related U.S. Application Data (60) Provisional application No. 62/677,537, filed on May 29, 2018.

(51) Int. Cl.
H01P 11/00 (2006.01)
C03C 4/04 (2006.01)
(Continued)

(52) U.S. Cl.
CPC .............. *H01P 11/001* (2013.01); *C03C 4/04* (2013.01); *C03C 17/06* (2013.01);
(Continued)

(58) Field of Classification Search
CPC .......... H01P 11/001; H01P 3/003; C03C 4/04; C03C 17/06; C03C 23/0005; H01Q 9/0407; H03H 7/0161; H03H 7/38
See application file for complete search history.

(56) References Cited

U.S. PATENT DOCUMENTS 2,515,940 A 7/1950 Stookey
2,515,941 A 7/1950 Stookey
(Continued)

FOREIGN PATENT DOCUMENTS

CN 1562831 A 4/2004
CN 105938928 9/2016
(Continued)

OTHER PUBLICATIONS

Aslan, et al, "Metal-Enhanced Fluorescence: an emerging tool in biotechnology" Current opinion in Biotechnology (2005), 16:55-62.
(Continued)

*Primary Examiner* — Minh N Trinh
(74) *Attorney, Agent, or Firm* — Edwin S. Flores; Chalker Flores, LLP (57) ABSTRACT The present invention includes a method of creating electrical air gap or other low loss low cost RF mechanically and thermally stabilized interdigitated resonate filter in photo definable glass ceramic substrate. A ground plane may be used to adjacent to or below the RF filter in order to prevent parasitic electronic signals, RF signals, differential voltage build up and floating grounds from disrupting and degrading the performance of isolated electronic devices by the fabrication of electrical isolation and ground plane structures on a photo-definable glass substrate.

17 Claims, 7 Drawing Sheets (51) Int. Cl.
  *H01P 3/00* (2006.01)
  *H01Q 9/04* (2006.01)
  *H03H 7/01* (2006.01)
  *H03H 7/38* (2006.01)
  *C03C 17/06* (2006.01)
  *C03C 23/00* (2006.01)

(52) U.S. Cl.
  CPC .......... *C03C 23/0005* (2013.01); *H01P 3/003* (2013.01); *H01Q 9/0407* (2013.01); *H03H 7/0161* (2013.01); *H03H 7/38* (2013.01); *H03H 2007/013* (2013.01)

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,514,053 A | 4/1985 | Borelli et al. |
| 4,537,612 A | 8/1985 | Borelli et al. |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | Dipaolo et al. |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,511,793 B1 | 1/2003 | Cho et al. |
| 6,514,375 B2 | 2/2003 | Kijima |
| 6,678,453 B2 | 1/2004 | Bellman et al. |
| 6,686,824 B1 | 2/2004 | Yamamoto et al. |
| 6,783,920 B2 | 8/2004 | Livingston et al. |
| 6,824,974 B2 | 11/2004 | Pisharody et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,755,305 B2 | 9/2017 | Desclos et al. |
| 9,819,991 B1 | 11/2017 | Rajagopalan et al. |
| 10,070,533 B2 | 9/2018 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0124716 A1 | 7/2003 | Hess et al. |
| 2003/0135201 A1 | 7/2003 | Gonnelli |
| 2003/0156819 A1 | 8/2003 | Pruss et al. |
| 2003/0228682 A1 | 12/2003 | Lakowicz et al. |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borrelli et al. |
| 2005/0089901 A1 | 4/2005 | Porter et al. |
| 2005/0170670 A1 | 8/2005 | King et al. |
| 2005/0277550 A1 | 12/2005 | Brown et al. |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0296520 A1 | 12/2007 | Hosokawa et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0245109 A1 | 10/2008 | Flemming et al. |
| 2008/0291442 A1 | 11/2008 | Lawandy |
| 2008/0305268 A1 | 12/2008 | Norman et al. |
| 2009/0029185 A1 | 1/2009 | Lee et al. |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemming et al. |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0161330 A1 | 6/2012 | Hlad et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0278568 A1 | 10/2013 | Lasiter et al. |
| 2013/0337604 A1 | 12/2013 | Ozawa et al. |
| 2014/0002906 A1 | 1/2014 | Shibuya |
| 2014/0035892 A1 | 2/2014 | Shenoy |

(56) References Cited

U.S. PATENT DOCUMENTS

| | | |
|---|---|---|
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0145326 A1 | 5/2014 | Lin et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0181211 A1 | 6/2016 | Kamagaing et al. |
| 2016/0254579 A1 | 9/2016 | Mills |
| 2016/0265974 A1 | 9/2016 | Erie et al. |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0323485 A1 | 11/2018 | Gnanou et al. |
| 2019/0190109 A1* | 6/2019 | Flemming .......... H01H 59/0009 |
| 2020/0275558 A1 | 8/2020 | Fujita |

FOREIGN PATENT DOCUMENTS

| | | |
|---|---|---|
| DE | 102004059252 A1 | 1/2006 |
| EP | 0311274 A1 | 12/1989 |
| EP | 0507719 A1 | 10/1992 |
| EP | 0949648 A1 | 10/1999 |
| EP | 1683571 A1 | 6/2006 |
| JP | 56-155587 | 12/1981 |
| JP | 61231529 A | 10/1986 |
| JP | 63-128699 A | 6/1988 |
| JP | H393683 A | 4/1991 |
| JP | 05139787 A | 6/1993 |
| JP | 10007435 A | 1/1998 |
| JP | 11344648 A | 12/1999 |
| JP | 2000228615 A | 8/2000 |
| JP | 2001033664 A | 2/2001 |
| JP | 2001206735 A | 7/2001 |
| JP | 2008252797 A | 10/2008 |
| JP | 2012079960 A | 4/2012 |
| JP | 2013217989 A | 10/2013 |
| JP | 2014241365 A | 12/2014 |
| JP | 2015028651 | 2/2015 |
| JP | 2015028651 A | 2/2015 |
| JP | H08026767 A | 1/2016 |
| KR | 100941691 B1 | 2/2010 |
| KR | 101167691 B1 | 7/2012 |
| WO | 2007088058 A1 | 8/2007 |
| WO | 2008119080 A1 | 10/2008 |
| WO | 2008154931 A1 | 12/2008 |
| WO | 2009029733 A2 | 3/2009 |
| WO | 2009062011 A1 | 5/2009 |
| WO | 2009126649 A2 | 10/2009 |
| WO | 2010011939 A2 | 1/2010 |
| WO | 2011100445 A1 | 8/2011 |
| WO | 2011109648 A1 | 9/2011 |
| WO | 2014062226 A1 | 1/2014 |
| WO | 2014043267 A1 | 3/2014 |
| WO | 2014062311 A1 | 4/2014 |
| WO | 2015112903 A1 | 7/2015 |
| WO | 2015171597 A1 | 11/2015 |
| WO | 2017132280 A2 | 8/2017 |
| WO | 2017147511 A1 | 8/2017 |
| WO | 2017177171 A1 | 10/2017 |
| WO | 2018200804 A1 | 1/2018 |
| WO | 2019010045 A1 | 1/2019 |
| WO | 2019118761 A1 | 6/2019 |
| WO | 2019136024 A1 | 7/2019 |
| WO | 2019199470 A1 | 10/2019 |
| WO | 2019231947 A1 | 12/2019 |

OTHER PUBLICATIONS

Azad, I., et al., "Design and Performance Analysis of 2.45 GHz Microwave Bandpass Filter with Reduced Harmonics," International Journal of Engineering Research and Development (2013), 5(11):57-67.

Bakir, Muhannad S., et al., "Revolutionary Nanosilicon Ancillary Technologies for Ultimate-Performance Gigascale Systems," IEEE 2007 Custom Integrated Circuits Conference (CICO), 2007, pp. 421-428.

Beke, S., et al., "Fabrication of Transparent and Conductive Microdevices," Journal of Laser Micro/Nanoengineering (2012), 7(1):28-32.

Brusberg, et al. "Thin Glass Based Packaging Technologies for Optoelectronic Modules" Electronic Components and Technology Conference, May 26-29, 2009, pp. 207-212, DOI:10.1109/ECTC. 2009.5074018, pp. 208-211; Figures 3, 8.

Cheng, et al. "Three-dimensional Femtosecond Laser Integration in Glasses" The Review of Laser Engineering, vol. 36, 2008, pp. 1206-1209, Section 2, Subsection 31.

Chowdhury, et al, "Metal-Enhanced Chemiluminescence", J Fluorescence (2006), 16:295-299.

Crawford, Gregory P., "Flexible Flat Panel Display Technology," John Wiley and Sons, NY, (2005), 9 pages.

Dang, et al. "Integrated thermal-fluidic I/O interconnects for an on-chip microchannel heat sink," IEEE Electron Device Letters, vol. 27, No. 2, pp. 117-119, 2006.

Dietrich, T.R., et al., "Fabrication Technologies for Microsystems Utilizing Photoetchable Glass," Microelectronic Engineering 30, (1996), pp. 407-504.

Extended European Search Report 157410325 dated Aug. 4, 2017, 11 pp.

Extended European Search Report 15789595.4 dated Mar. 31, 2017, 7 pp.

Extended European Search Report 17744848.7 dated Oct. 30, 2019, 9 pp.

Extended European Search Report 17757365.6 dated Oct. 14, 2019, 14 pp.

Geddes, et al, "Metal-Enhanced Fluorescence" J Fluorescence, (2002), 12:121-129.

Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.

Intel Corporation, "Intel® 82566 Layout Checklist (version 1.0)", 2006.

International Search Report and Written Opinion for PCT/US2008/058783 dated Jul. 1, 2008, 15 pp.

International Search Report and Written Opinion for PCT/US2008/074699 dated Feb. 26, 2009, 11 pp.

International Search Report and Written Opinion for PCT/US2009/039807 dated Nov. 24, 2009, 13 pp.

International Search Report and Written Opinion for PCT/US2009/051711 dated Mar. 5, 2010, 15 pp.

International Search Report and Written Opinion for PCT/US2011/024369 dated Mar. 25, 2011, 13 pp.

International Search Report and Written Opinion for PCT/US2013/059305 dated Jan. 10, 2014, 6 pp.

International Search Report and Written Opinion for PCT/US2015/012758 dated Apr. 8, 2015, 11 pp.

International Search Report and Written Opinion for PCT/US2015/029222 dated Jul. 22, 2015, 9 pp.

International Search Report and Written Opinion for PCT/US2017/019483 dated May 19, 2017, 11 pp.

International Search Report and Written Opinion for PCT/US2017/026662 dated Jun. 5, 2017, 11 pp.

International Search Report and Written Opinion for PCT/US2018/029559 dated Aug. 3, 2018, 9 pp.

International Search Report and Written Opinion for PCT/US2018/039841 dated Sep. 20, 2018 by Australian Patent Office, 12 pp.

International Search Report and Written Opinion for PCT/US2018/065520 dated Mar. 20, 2019 by Australian Patent Office, 11 pp.

(56) References Cited

OTHER PUBLICATIONS

International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2019/50644 dated Dec. 4, 2019 by USPTO, 9 pp.
International Technology Roadmap for Semiconductors, 2007 Edition, "Assembly and Packaging," 9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
Topper, et al., "Development of a high density glass interposer based on wafer level packaging technologies," 2014 IEEE 64th Electronic Components and Technology Conference, May 27, 2014, pp. 1498-1503.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
International Search Report and Written Opinion for PCT/US2020/026673 dated Jun. 22, 2020, by the USPTO, 13 pp.
International Search Report and Written Opinion for PCT/US2020/28474 dated Jul. 17, 2020 by the USPTO, 7 pp.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.

* cited by examiner

Ground Plane under filter

FIG. 8

Ground Plane under filter

METHOD OF MAKING A MECHANICALLY STABILIZED RADIO FREQUENCY TRANSMISSION LINE DEVICE

CROSS-REFERENCE TO RELATED APPLICATIONS

This application is the National Stage of International Application No. PCT/US2019/034245, filed on May 29, 2019 claiming the priority to U.S. Provisional Application No. 62/677,537 filed on May 29, 2018, the contents of each of which are incorporated by reference herein.

STATEMENT OF FEDERALLY FUNDED RESEARCH

None.

TECHNICAL FIELD OF THE INVENTION

The present invention relates to making a mechanically stabilized radio-frequency (RF) transmission line device.

BACKGROUND OF THE INVENTION

Without limiting the scope of the invention, its background is described in connection with impedance matching.

One such example is taught in U.S. Pat. No. 9,819,991, issued to Rajagopalan, et al., entitled "Adaptive impedance matching interface". These inventors are said to teach a device, that includes a data interface connector, an application processor, and interface circuitry. Interface circuitry is said to be coupled between the application processor and the data interface connector, in which the data interface circuitry determines a change in a signal property of one of the signals, the change being caused by an impedance mismatch between the data interface connector and a media consumption device. The application processor is said to adjust the signal property of a subsequent one of the signals, in response to the signal property setting from the interface circuitry, to obtain an adjusted signal, or can send the adjusted signal to the media consumption device.

Another such example is taught in U.S. Pat. No. 9,755,305, issued to Desclos, et al., and entitled "Active antenna adapted for impedance matching and band switching using a shared component". Briefly, these inventors are said to teach an active antenna and associated circuit topology that is adapted to provide active impedance matching and band switching of the antenna using a shared tunable component, e.g., using a shared tunable component, such as a tunable capacitor or other tunable component. The antenna is said to provide a low cost and effective active antenna solution, e.g., one or more passive components can be further utilized to design band switching of the antenna from a first frequency to a second desired frequency.

However, despite these advances, a need remains compact low loss RF transmission line and affiliated devices (filters).

SUMMARY OF THE INVENTION

In one embodiment, the present invention includes a method of making a mechanically stabilized RF transmission line device comprising: masking a design layout comprising one or more structures that form one or more transmission line structures on a photosensitive glass substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass into a glass-crystalline substrate; etching the glass-crystalline substrate with an etchant solution to form one or more trenches and a mechanical support under the design layout of the one or more transmission line structures with electrical conduction channels; and printing or depositing one or more metals or metallic media that form the one or more electrical conductive transmission lines, a ground plane and one or more input and output channels, wherein the metal is connected to a circuitry that forms the RF transmission line device, and at least one of the electrical conductive transmission lines is mechanically supported by the mechanical support. In one aspect, the device is covered with a coating or lid that covers all or part of at least one of: the electrical conductive transmission lines, ground plane and input and output channels with the metal or metallic media further comprises connecting the metal or metallic media to a ground. In another aspect, the mechanical support is a low loss tangent mechanical and thermal stabilization structure under the one or more electrical conductive transmission lines that is less than or equal to 100% of the contact area of the one or more electrical conductive transmission lines. In another aspect, the mechanical support is a low loss tangent mechanical support under less than 50% of the contact area of the one or more electrical conductive transmission lines. In another aspect, the mechanical support is a low loss tangent mechanical support under less than 10% of the contact area of the one or more electrical conductive transmission lines. In another aspect, the mechanical support is a low loss tangent mechanical support under less than 1% of the contact area of the one or more electrical conductive transmission lines. In another aspect, the mechanical support forms a support pedestal with an integrated ceramic core with glass cladding. In another aspect, the support pedestal has a glass cladding that is less than 40% of the volume of the pedestal. In another aspect, the support pedestal has a glass cladding that is less than 20% of the volume of the support pedestal. In another aspect, the support pedestal has a glass cladding that is less than 10% of the volume of the support pedestal. In another aspect, the support pedestal has a glass cladding that is less than 5% of the volume of the support pedestal. In another aspect, the mechanically stabilized RF transmission line device is a bandpass, shunt low pass, high pass, or notch. In another aspect, the metal or metal media comprises at least one of: titanium, titanium-tungsten, chrome, copper, nickel, gold, palladium or silver. In another aspect, the step of etching forms an air gap between the substrate and the one or more electrical conductive transmission lines, wherein the structure is connected to one or more RF electronic elements. In another aspect, the glass-crystalline substrate adjacent to the trenches is converted to a ceramic phase. In another aspect, the metal is connected to the circuitry through a surface, a buried contact, a blind via, a glass via, a straight-line contact, a rectangular contact, a polygonal contact, or a circular contact. In another aspect, the photosensitive glass substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % $K_2O$, 0.003-1 weight % $Ag_2O$, 8-15 weight % $Li_2O$, and 0.001-0.1 weight % $CeO_2$. In another aspect, the photosensitive glass substrate is at least one of: a photo-definable glass substrate comprises at least 0.1 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO, SrO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the photosensitive glass substrate is a photosensitive glass ceramic composite substrate comprising at least one of silica, lithium oxide, aluminum oxide, or cerium oxide. In another aspect, the RF transmission line device has a loss of less than 50, 40, 30, 25, 20, 15, or 10% of the signal input versus a signal output. In another aspect, the RF transmission line device has a loss of less than 0.4 dB/cm at 30 Ghz. In another aspect, the method further comprises forming one or more RF mechanically and thermally stabilized interdigitated resonate structures using the method into a feature of at least one of a patch antenna, transmission line, delay line, bandpass, low pass, high pass, or notch filter. In another aspect, the RF transmission line has mechanical support under less than 10% of the contact area of the RF interdigitated resonate structure. In another aspect, the RF transmission line device has mechanical and thermal stabilization structure is under less than 5% of the contact area. In another aspect, the RF transmission line device is an RF filter line that has the mechanical and thermal stabilization structure under less than 1% of the contact area of the one or more electrical conductive transmission lines.

In another embodiment, the present invention includes a method of making a mechanically stabilized RF transmission line device comprising: masking a design layout comprising one or more structures that form one or more transmission line structures with electrical conduction channels on a photosensitive glass substrate; exposing at least one portion of the photosensitive glass substrate to an activating energy source; heating the photosensitive glass substrate for at least ten minutes above its glass transition temperature; cooling the photosensitive glass substrate to transform the at least one portion of the photosensitive glass substrate exposed to the activating energy source to a crystalline material to form a glass crystalline substrate; etching the glass-crystalline substrate with an etchant solution to form a mechanical support device; and coating the one or more electrical conductive interdigitated transmission lines, ground plane and input and output channels with one or more metals, wherein the one or more metals are connected to a circuitry. In one aspect, the method further comprises forming one or more RF mechanically and thermally stabilized interdigitated resonate structures into a feature of at least one of a patch antenna, transmission line, delay line, bandpass, low pass, high pass, or notch filter. In one aspect, the device is covered with a coating or lid that covers all or part of at least one of: the electrical conductive transmission lines, ground plane and input and output channels with the metal or metallic media further comprises connecting the metal or metallic media to a ground. In another aspect, the mechanical support is a low loss tangent mechanical and thermal stabilization structure under the one or more electrical conductive transmission lines that is less than or equal to 100% of the contact area of the one or more electrical conductive transmission lines. In another aspect, the mechanical support is a low loss tangent mechanical support under less than 50% of the contact area of the one or more electrical conductive transmission lines. In another aspect, the mechanical support is a low loss tangent mechanical support under less than 10% of the contact area of the one or more electrical conductive transmission lines. In another aspect, the mechanical support is a low loss tangent mechanical support under less than 1% of the contact area of the one or more electrical conductive transmission lines. In another aspect, the mechanical support forms a support pedestal with an integrated ceramic core with glass cladding. In another aspect, the support pedestal has a glass cladding that is less than 40% of the volume of the pedestal. In another aspect, the support pedestal has a glass cladding that is less than 20% of the volume of the support pedestal. In another aspect, the support pedestal has a glass cladding that is less than 10% of the volume of the support pedestal. In another aspect, the support pedestal has a glass cladding that is less than 5% of the volume of the support pedestal. In another aspect, the mechanically stabilized RF transmission line device is a bandpass, shunt low pass, high pass, or notch. In another aspect, the metal or metal media comprises at least one of: titanium, titanium-tungsten, chrome, copper, nickel, gold, palladium or silver. In another aspect, the step of etching forms an air gap between the substrate and the one or more electrical conductive transmission lines, wherein the structure is connected to one or more RF electronic elements. In another aspect, the glass-crystalline substrate adjacent to the trenches is converted to a ceramic phase. In another aspect, the metal is connected to the circuitry through a surface, a buried contact, a blind via, a glass via, a straight-line contact, a rectangular contact, a polygonal contact, or a circular contact. In another aspect, the photosensitive glass substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % $K_2O$, 0.003-1 weight % $Ag_2O$, 8-15 weight % $Li_2O$, and 0.001-0.1 weight % $CeO_2$. In another aspect, the photosensitive glass substrate is at least one of: a photo-definable glass substrate comprises at least 0.1 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO, SrO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the photosensitive glass substrate is a photosensitive glass ceramic composite substrate comprising at least one of silica, lithium oxide, aluminum oxide, or cerium oxide. In another aspect, the RF transmission line device has a loss of less than 50, 40, 30, 25, 20, 15, or 10% of the signal input versus a signal output. In another aspect, the RF transmission line device has a loss of less than 0.4 dB/cm at 30 Ghz. In another aspect, the method further comprises forming one or more RF mechanically and thermally stabilized interdigitated resonate structures using the method into a feature of at least one of a patch antenna, transmission line, delay line, bandpass, low pass, high pass, or notch filter. In another aspect, the RF transmission line has mechanical support under less than 10% of the contact area of the RF interdigitated resonate structure. In another aspect, the RF transmission line device has mechanical and thermal stabilization structure is under less than 5% of the contact area. In another aspect, the RF transmission line device is an RF filter line that has the mechanical and thermal stabilization structure under less than 1% of the contact area of the one or more electrical conductive transmission lines.

In another embodiment, the present invention includes an antenna comprising: one or more transmission line structures over a glass pedestal in an etched well and one or more grounds separated from the one or more transmission line structures to form the antenna. In one aspect, the device is covered with a coating or lid that covers all or part of at least one of: the electrical conductive transmission lines, ground plane and input and output channels with the metal or metallic media further comprises connecting the metal or metallic media to a ground. In another aspect, the mechanical support is a low loss tangent mechanical and thermal stabilization structure under the one or more electrical conductive transmission lines that is less than or equal to 100% of the contact area of the one or more electrical conductive transmission lines. In another aspect, the mechanical support is a low loss tangent mechanical support under less than 50% of the contact area of the one or more electrical conductive transmission lines. In another aspect, the mechanical support is a low loss tangent mechanical support under less than 10% of the contact area of the one or more electrical conductive transmission lines. In another aspect, the mechanical support is a low loss tangent mechanical support under less than 1% of the contact area of the one or more electrical conductive transmission lines. In another aspect, the mechanical support forms a support pedestal with an integrated ceramic core with glass cladding. In another aspect, the support pedestal has a glass cladding that is less than 40% of the volume of the pedestal. In another aspect, the support pedestal has a glass cladding that is less than 20% of the volume of the support pedestal. In another aspect, the support pedestal has a glass cladding that is less than 10% of the volume of the support pedestal. In another aspect, the support pedestal has a glass cladding that is less than 5% of the volume of the support pedestal. In another aspect, the mechanically stabilized RF transmission line device is a bandpass, shunt low pass, high pass, or notch. In another aspect, the metal or metal media comprises at least one of: titanium, titanium-tungsten, chrome, copper, nickel, gold, palladium or silver. In another aspect, the step of etching forms an air gap between the substrate and the one or more electrical conductive transmission lines, wherein the structure is connected to one or more RF electronic elements. In another aspect, the glass-crystalline substrate adjacent to the trenches is converted to a ceramic phase. In another aspect, the metal is connected to the circuitry through a surface, a buried contact, a blind via, a glass via, a straight-line contact, a rectangular contact, a polygonal contact, or a circular contact. In another aspect, the photosensitive glass substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$, with the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % $K_2O$, 0.003-1 weight % $Ag_2O$, 8-15 weight % $Li_2O$, and 0.001-0.1 weight % $CeO_2$. In another aspect, the photosensitive glass substrate is at least one of: a photo-definable glass substrate comprises at least 0.1 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO, SrO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the photosensitive glass substrate is a photosensitive glass ceramic composite substrate comprising at least one of silica, lithium oxide, aluminum oxide, or cerium oxide. In another aspect, the RF transmission line device has a loss of less than 50, 40, 30, 25, 20, 15, or 10% of the signal input versus a signal output. In another aspect, the RF transmission line device has a loss of less than 0.4 dB/cm at 30 Ghz. In another aspect, the method further comprises forming one or more RF mechanically and thermally stabilized interdigitated resonate structures using the method into a feature of at least one of a patch antenna, transmission line, delay line, bandpass, low pass, high pass, or notch filter. In another aspect, the RF transmission line has mechanical support under less than 10% of the contact area of the RF interdigitated resonate structure. In another aspect, the RF transmission line device has mechanical and thermal stabilization structure is under less than 5% of the contact area. In another aspect, the RF transmission line device is an RF filter line that has the mechanical and thermal stabilization structure under less than 1% of the contact area of the one or more electrical conductive transmission lines.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

In one embodiment, the present invention includes a method of making a mechanically stabilized RF transmission line comprising: masking a design layout comprising one or more structures to form one or more combination of a linear, curved, rectangular, fractal or other patterned structures with electrical conduction channels. Depending on the design the RF transmission line it can be a low loss transmission line, inductor, capacitor, filter or antenna.

An RF transmission line device can be made on a photosensitive glass substrate generally by exposing at least one portion of the photosensitive glass substrate to an activating energy source; heating the photosensitive glass substrate for at least ten minutes above its glass transition temperature; cooling the photosensitive glass substrate to transform the at least one portion of the photosensitive glass substrate exposed to the activating energy source to a crystalline material to form a glass crystalline substrate; etching the glass-crystalline substrate with an etchant solution to form a mechanical support device; and coating the one or more electrical conductive transmission line, ground plane and input and output channels with one or more metals, wherein the one or more metals are connected to a circuitry.

In one aspect, the device is covered with a lid covering all or part of the external electrical isolation structure with a metal or metallic media further comprises connecting the metal or metallic media to a ground. In another aspect, the RF filter (RF transmission line filter (bandpass, low pass, high pass, shunt or notch) has mechanical and thermal stabilization low loss tangent structure is under less than or equal to 100% of the contact area of the RF transmission line structure where the contact area between the support pedestal and transmission line is mostly a ceramic phase in the photodefinable glass. In another aspect, the RF transmission line has mechanical support under less than 50% of the contact area of the RF transmission line structure where the contact area of the support pedestal and transmission line is mostly a ceramic phase in the photodefinable glass. In another aspect, the RF transmission line has RF transmission line structure where the contact area of the support pedestal and transmission line is mostly a ceramic phase in the photodefinable glass. In another aspect, the RF transmission line has mechanical and thermal stabilization structure is under less than 5% of the contact area of the RF transmission line structure where the contact area of the support pedestal and transmission line is mostly a ceramic phase in the photodefinable glass. In another aspect, the RF transmission line has mechanical and thermal stabilization structure is under less than 1% of the contact area of the RF transmission line structure where the contact area of the support pedestal and transmission line is mostly a ceramic phase in the photodefinable glass. In another aspect, the metallization forms a RF transmission line.

In another aspect, the RF transmission line that is linear, curved, rectangular, fractal or other patterned structures with electrical connect to other RF or DC electronic devices. In another aspect, a metal line on the RF transmission line is comprised of titanium, titanium-tungsten, chrome, copper, nickel, gold, palladium or silver. In another aspect, the step of etching forms an air gap between the substrate and the RF transmission line that is linear, curved, rectangular, fractal or other patterned structure, wherein the structure is connected to other RF electronic elements. In another aspect, the glass-crystalline substrate adjacent to the trenches may also be converted to a ceramic phase. In another aspect, the one or more metals are selected from Fe, Cu, Au, Ni, In, Ag, Pt, or Pd. In another aspect, the metal is connected to the circuitry through a surface a buried contact, a blind via, a glass via, a straight-line contact, rectangular contact, a polygonal contact, or a circular contact.

In another aspect, the photosensitive glass substrate is a glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; and the combination of $B_2O_3$; and $Al_2O_3$ not exceeding 13 weight %; 8-15 weight % $Li_2O$; and 0.001-0.1 weight % $CeO_2$. In another aspect, the photosensitive glass substrate is a glass substrate comprising a composition of: 35-76 weight % silica, 3-16 weight % $K_2O$, 0.003-1 weight % $Ag_2O$, 8-15 weight % $Li_2O$, and 0.001-0.1 weight % $CeO_2$. In another aspect, the photosensitive glass substrate is at least one of: a photo-definable glass substrate comprises at least 0.1 weight % $Sb_2O_3$ or $As_2O_3$; a photo-definable glass substrate comprises 0.003-1 weight % $Au_2O$; a photo-definable glass substrate comprises 1-18 weight % of an oxide selected from the group consisting of CaO, ZnO, PbO, MgO, SrO and BaO; and optionally has an anisotropic-etch ratio of exposed portion to said unexposed portion is at least one of 10-20:1; 21-29:1; 30-45:1; 20-40:1; 41-45:1; and 30-50:1. In another aspect, the photosensitive glass substrate is a photosensitive glass ceramic composite substrate comprising at least one of silica, lithium oxide, aluminum oxide, or cerium oxide. In another aspect, the RF transmission has a loss of less than 50, 40, 30, 25, 20, 15, or 10% of the signal input versus a signal output. In another aspect, the method further comprises forming the RF mechanically and thermally stabilized low loss transmission line structure into a feature of at least one of a transmit information, bandpass, low pass, high pass, shunt or notch filter.

In another embodiment, the present invention includes a mechanically stabilized RF transmission line device made by a method comprising: masking a design layout comprising one or more structures to form one or more interdigitated structures with electrical conduction channels on a photosensitive glass substrate; exposing at least one portion of the photosensitive glass substrate to an activating energy source; heating the photosensitive glass substrate for at least ten minutes above its glass transition temperature; cooling the photosensitive glass substrate to transform at least part of the exposed glass to a crystalline material to form a glass-crystalline substrate; etching the glass-crystalline substrate with an etchant solution to form a mechanical support device; coating one or more electrical conductive interdigitated transmission line, ground plane and input and output channels with one or more metals; and coating all or part of the one or more electrical conductive RF transmission line with a metallic media, wherein the metal is connected to a circuitry. In one aspect, the device is covered with a lid coating of all or part of the external electrical isolation structure with a metal or metallic media further comprises connecting the metal or metallic media to a ground.

The present invention relates to creating a low insertion loss transmission line that are RF transmission elements including: RF transmission lines, RF Filters, RF Inductors, RF Capacitors, RF Couplers and/or RF antennas. These devices can be made compact low loss and cost effective RF elements that are critical devices for the future of efficiency RF communication systems particularly for portable of long transmission systems. Photosensitive glass structures have been suggested for a number of micromachining and microfabrication processes such as integrated electronic elements in conjunction with other elements systems or subsystems. Semiconductor microfabrication using thin film additive processes on semiconductor, insulating or conductive substrates is expensive with low yield and a high variability in performance. An example of additive micro-transmission can be seen in articles Semiconductor Microfabrication Processes by Tian et al. rely on expensive capital equipment; photolithography and reactive ion etching or ion beam milling tools that generally cost in excess of one million dollars each and require an ultra-clean, high-production silicon fabrication facility costing millions to billions more. This invention provides a cost effective glass ceramic electronic individual device or as an array of passive devices for a uniform response for RF frequencies with low loss. Equation 1:

$$Z_0 = \frac{60}{\sqrt{\varepsilon_{\it eff}}} \cdot \ln\left(\frac{8h}{w} + \frac{w}{4h}\right) \text{ if } \frac{w}{h} < 1$$

As used herein the terms "APEX® Glass ceramic", "APEX® glass" or simply "APEX®" is used to denote one embodiment of the glass ceramic composition of the present invention. The APEX® composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boronoxide produces a much more homogeneous glass during manufacturing.

The present invention includes a method for fabricating a low loss RF Filter structure in APEX® Glass structure for use in forming interdigitated structures with mechanical stabilization and electrical isolation in a glass ceramic material used. The present invention includes interdigitated structures to create in multiple planes of a glass-ceramic substrate, such process employing the (a) exposure to excitation energy such that the exposure occurs at various angles by either altering the orientation of the substrate or of the energy source, (b) a bake step and (c) an etch step. The mechanically stabilized structures are difficult, if not infeasible to create in most glass, ceramic or silicon substrates. The present invention has created the capability to create such structures in both the vertical as well as horizontal plane for glass-ceramic substrates.

Ceramicization of the glass is accomplished by exposing a region of the APEX® Glass substrate to approximately 20 J/cm² of 310 nm light. In one embodiment, the present invention provides a quartz/chrome mask containing a variety of concentric circles with different diameters.

The characteristic impedance for a transmission line is given in Equation 1. For our low loss transmission line the width of the line can vary between 2 μm to 1,000 μm but is typically 200 μm. The height of the transmission line above the ground plane can vary between 20 μm to 1,000 μm above the ground plane but is typically 200 μm. This allows designer to produce a 50 Ohm transmission line for low loss and impedance matching. An example is a 20 μm wide transmission line that is ~6.5 μm above the ground plane where the transmission line is supported 5% of the structure by glass/ceramic. The glass ceramic has a dielectric constant of that is approximately 30% less than the glass and the rest of the structure has air with a dielectric constant of 1 and a loss tangent of 0. This produces an average $e_{\it eff}$ of 1.3 and results in an impedance of 50.2 Ohms and a very low loss tangent.

The RF transmission line is one of the most common device structures in RF electronics. Traditional RF transmission lines are made by precision machining metal and electropolished for surface finish to produce a self-supporting RF elements/transmission line that have no supporting dielectric material. Using traditional thin film or additive manufacturing technology to produce transmission line elements that are not mechanically or dimensionally stable. The mechanical or dimensional instability forced the use of a solid dielectric substrate, such as quartz to produce transmission line elements for a transmitting signals or acting as a filter creating large insertion losses well in excess of 3 dB. This level of loss has precludes the use of a transmission line as a transmission device or as a pass filters in commercial cellular communication markets. The present invention includes a method to fabricate a compact RF transmission that can be used to create a transmission line to transmit data, filters, antennas or other RF devices in a photodefinable glass ceramic substrate. To produce the present invention the inventors developed a glass ceramic (APEX® Glass ceramic) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. Photodefinable glass has several advantages for the fabrication of a wide variety of microsystems components.

Microstructures have been produced relatively inexpensively with these glasses using conventional semiconductor processing equipment. In general, glasses have high temperature stability, good mechanical a n d electrically properties, and have better chemical resistance than plastics and many metals. Photoetchable glass is comprised of lithium-aluminum-silicate glass containing traces of silver ions. When exposed to UV-light within the absorption band of cerium oxide, the cerium oxide acts as sensitizers, absorbing a photon and losing an electron that reduces neighboring silver oxide to form silver atoms, e.g., The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g. Greater than 465° C. in air). The crystalline phase is more soluble in etchants, such as hydrofluoric acid (HF), than the unexposed vitreous, amorphous regions. The crystalline regions etched greater than 20 times faster than the amorphous regions in 10% HF, enabling microstructures with wall slopes ratios of about 20:1 when the exposed regions are removed. See T. R. Dietrich, et al., "Fabrication Technologies for Microsystems utilizing Photoetchable Glass", Microelectronic Engineering 30, 497 (1996), relevant portions of which are incorporated herein by reference.

The present invention includes a method for fabricating a compact efficient RF filters using mechanically stabilized interdigitated resonate structures connect different electronic devices fabricated in or attached to the photosensitive glass. The photosensitive glass substrate can have a wide number of compositional variations including but not limited to: 60-76 weight % silica; at least 3 weight % $K_2O$ with 6 weight %-16 weight % of a combination of K2O and Na2O; 0.003-1 weight % of at least one oxide selected from the group consisting of Ag2O and Au2O; 0.003-2 weight % Cu2O; 0.75 weight %-7 weight % B2O3, and 6-7 weight % Al2O3; with the combination of B2O3; and Al2O3 not exceeding 13 weight %; 8-15 weight % Li2O; and 0.001-0.1 weight % CeO2. This and other varied compositions are generally referred to as the APEX® glass.

The exposed portion may be transformed into a crystalline material by heating the glass substrate to a temperature near the glass transformation temperature. When etching the glass substrate in an etchant such as hydrofluoric (HF) acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to provide a lens shaped glass structure. The exposed glass is then baked typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, where in the etch ratio of exposed portion to that of the unexposed portion is at least 30:1. Create the mechanically and thermally stabilized interdigitated resonate structure through thin film additive and subtractive processes requires the general processing approach.

Figure 1:
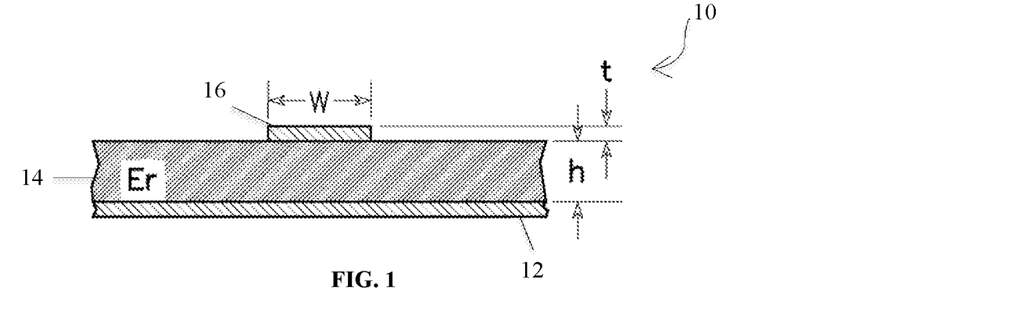
FIG. 1 shows a cross section of traditional transmission line.

FIG. 1 shows a cross section of traditional transmission line 10 that includes a substrate 12, a dielectric 14, and conductor 16.

Figure 2:
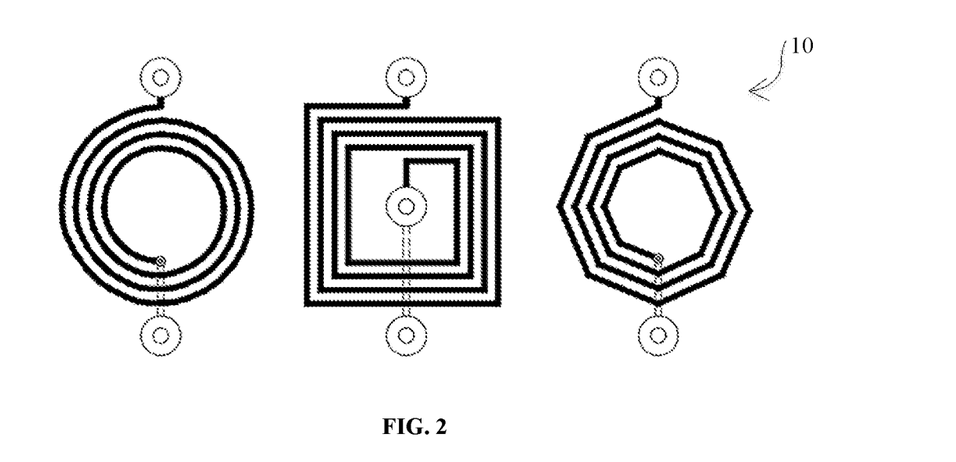
FIG. 2 shows schematic of a transmission line inductors/antenna.

FIG. 2 shows schematic top-view of a transmission line inductors/antenna 10 in various configurations, including a round, square and polygonal shape that can be made using the present invention.

Figure 3:
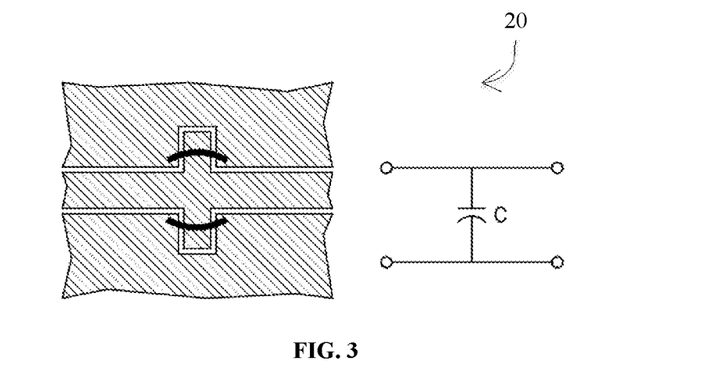
FIG. 3 shows a schematic for a traditional coplanar transmission line shunt capacitor.

FIG. 3 shows a schematic for a traditional coplanar transmission line shunt capacitor 20 that can be made using the present invention, with the basic structure on the left and electrical diagram on the right.

Figure 4:
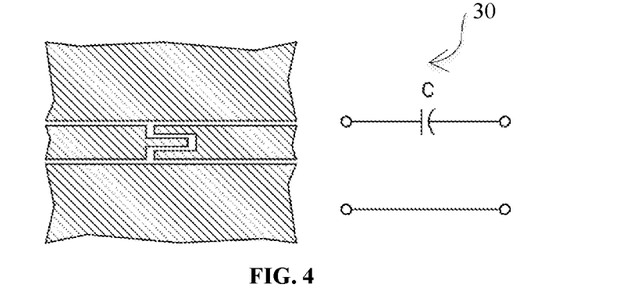
FIG. 4 shows a schematic for a traditional coplanar transmission line Series Capacitor.

FIG. 4 shows a schematic for a traditional coplanar transmission line Series Capacitor 30 that can be made using the present invention, with the basic structure on the left and electrical diagram on the right.

Figure 5:
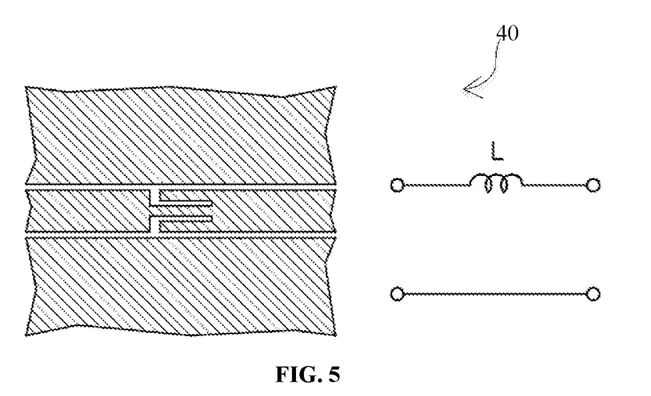
FIG. 5 shows a schematic for a traditional coplanar transmission line Series Inductor.

FIG. 5 shows a schematic for a traditional coplanar transmission line Series Inductor 40 that can be made using the present invention, with the basic structure on the left and electrical diagram on the right.

Figure 6:
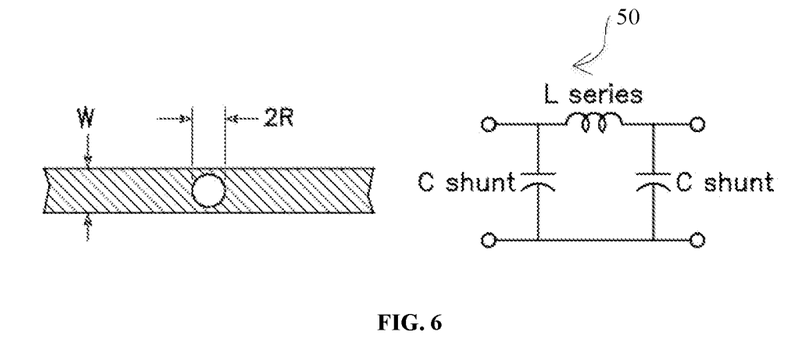
FIG. 6 shows a schematic for a transmission line round hole filter.

FIG. 6 shows a schematic for a transmission line round hole filter 50 that can be made using the present invention, with the basic structure on the left and electrical diagram on the right.

Figure 7:
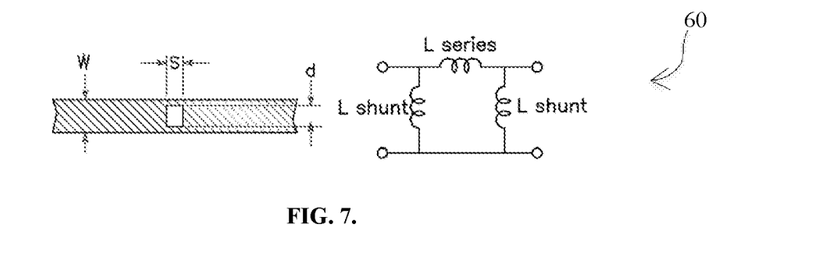
FIG. 7 shows a schematic for a transmission line rectangular hole centered filter. The equations for the filter can be found in Wadell pages 350 through 370.

FIG. 7 shows a schematic for a transmission line rectangular hole centered filter 60 that can be made using the present invention, with the basic structure on the left and electrical diagram on the right. The equations for the filter can be found in Wadell pages 350 through 370.

Figure 8:
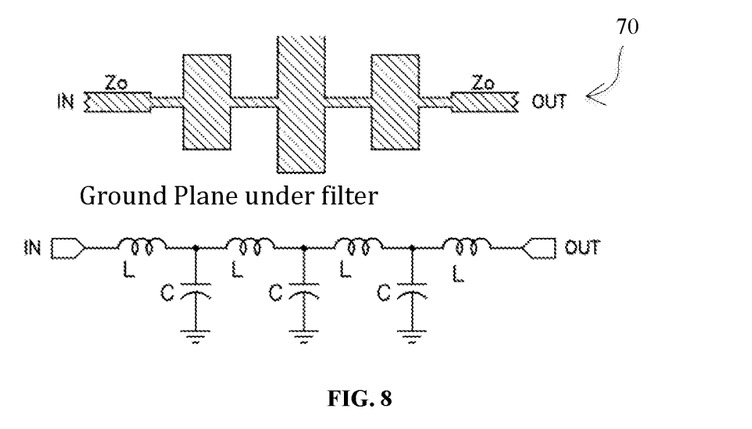
FIG. 8 shows a schematic for a transmission line based low pass filter.

FIG. 8 shows a schematic for a transmission line based low pass filter 70 that can be made using the present invention, with the basic structure on the top and electrical diagram on the bottom.

Figure 9:
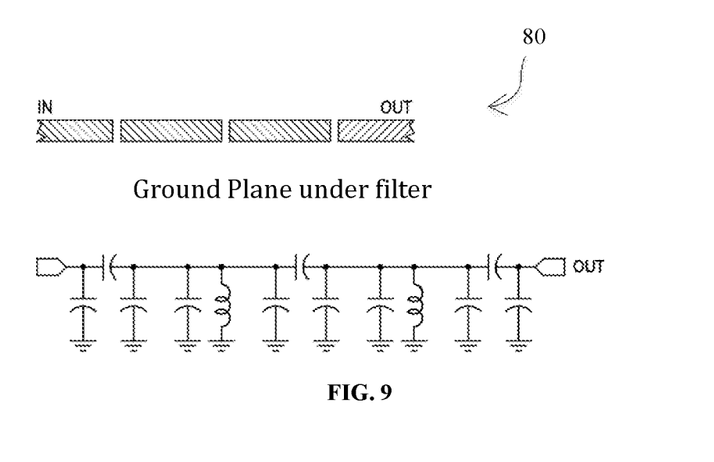
FIG. 9 shows a schematic for an end coupled transmission line filter.

FIG. 9 shows a schematic for an end coupled transmission line filter 80 that can be made using the present invention, with the basic structure on the top and electrical diagram on the bottom.

Figure 10:
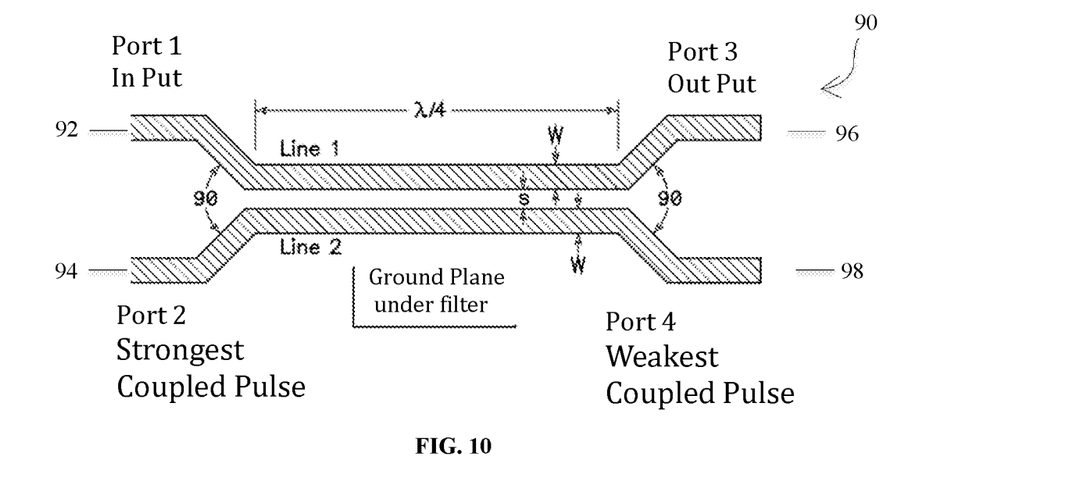
FIG. 10 shows a schematic for a coupled transmission line filter.

FIG. 10 shows a schematic for a coupled transmission line filter 90 that can be made using the present invention. The coupled transmission line filter 90 includes an input port 1 (92) and a port 2 (94), the input port 1 (92) forms line 1 and is in electrical communication with port 3 (96). Port 4 (98) is in electrical communication via line 2 with port 2 (94). The lines 1 and 2 are separated by a distance S, and each of line 1 and 2 have a width W. In this embodiment, the Port 1 (92) and Port (2) 94 form a 90 degree angle therebetween, as do port 3 (96) and port 4 (98). The Port 4 (98) is weakly coupled to pulses in line 1, while port 2 (94) has the strongest coupling to line 1. A ground plane under filter is provided under the lines.

Figure 11:
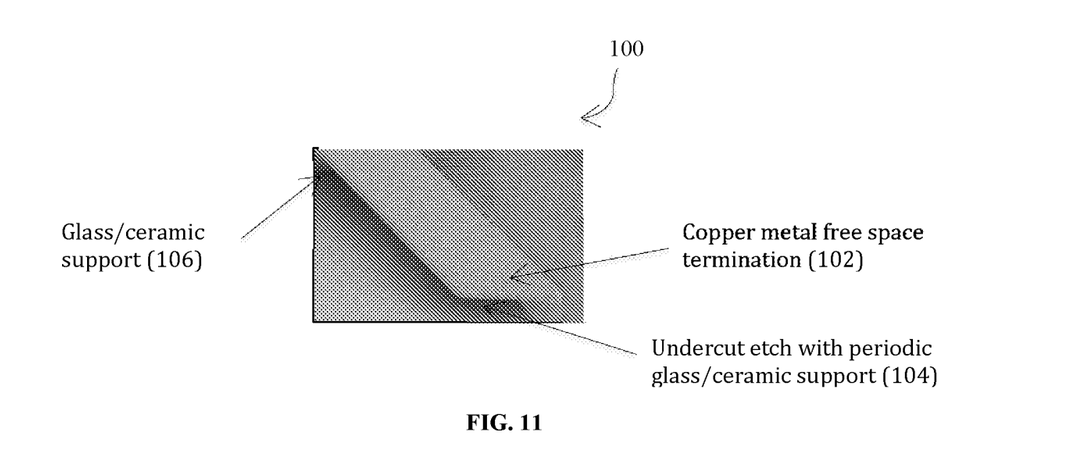
FIG. 11 shows an image of a glass/ceramic supported transmission line.

FIG. 11 shows an image of a glass/ceramic supported transmission line 100. The glass/ceramic supported transmission line 100 is shown in relation to the copper metal free space termination 102, an undercut etch with periodic glass/ceramic support 104, and the glass ceramic support 106.

Figure 12:
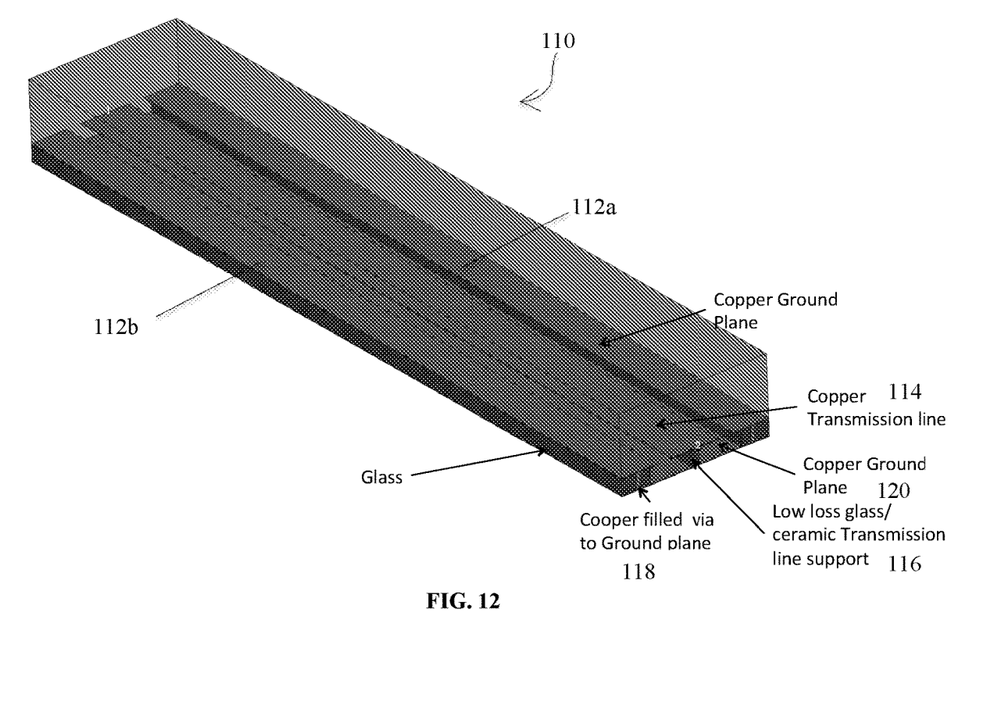
FIG. 12 shows a schematic of the low loss transmission line with a glass ceramic support.

There are many RF transmission line dies on a single wafer where the specific number of die are a function of the wafer diameter. The substrate is 6" in diameter is exposed with approximately 20 J/cm² of 310 nm light. FIG. 12 shows a detailed, isometric schematic of a low loss transmission line 110 with a glass ceramic support. In FIG. 12, two rectangular top ground plane structures 112a, 112b ranging from 200 μm to 5 μm (in some cases 50 μm) in width are shown, where the top ground plane structures 112a, 112b are the same length as the transmission line 114 (e.g., a copper or other conductive material). The transmission line 114 can range from 1,000 μm to 5 μm in width (in some cases 200 μm in width) and can range from 50 μm to 1 μm in thick (in some cases 10 μm thick). The transmission line 114 is supported by a glass ceramic pedestal 116. The interior of the pedestal 116 is of the ceramic phase of the photodefinable glass. The pedestal can range from 200 μm to 5 μm in thickness and (in some cases 100 μm thick). The glass phase of the pedestal 116 can range from 2% to 90% of the exterior thickness of the pedestal (in some cases 20% of exterior pedestal). As an example, a 10 μm glass pedestal 114 would have a ceramic phase center of 6 μm to forming the glass/ceramic pedestal with 2 μm of glass phase as the support pedestal of the transmission line 114. The ceramic core can have a loss tangent and dielectric constant 30% less than the glass. Glass thickness is ranges form 750 μm to 50 μm (in some cases 200 μm). The top copper ground planes 112a, 112b, range form 200 μm to 5 μm (in some cases 30 μm). The copper filled via 118 range from 200 μm to 5 μm in diameter (in some cases 50 μm diameter) and connects the top ground plane structures 112a, 112b with a bottom ground plane 120 (e.g., a copper or other conductive material).

In one variant of FIG. 12, the present invention is also an antenna comprising one or more empty cavity structures over a glass or metal pedestal in an etched well and one or more grounds separated from the one or more transmission line structures to form the antenna.

In another aspect, the RF filter (RF transmission line filter (bandpass, low pass, high pass, shunt or notch)) has mechanical and thermal stabilization low loss tangent structure is under less than or equal to 100% of the contact area of the RF transmission line structure where the contact area between the support pedestal and transmission line is mostly a ceramic phase in the photodefinable glass. In another aspect, the RF transmission line has mechanical support under it, which is less than 50% of the contact area of the RF transmission line structure where the contact area of the support pedestal and transmission line is mostly a ceramic phase in the photodefinable glass. In another aspect, the RF transmission line has RF transmission line structure where the contact area of the support pedestal and transmission line is mostly a ceramic phase in the photodefinable glass. In another aspect, the RF transmission line has mechanical and thermal stabilization structure is under less than 5% of the contact area of the RF transmission line structure where the contact area of the support pedestal and transmission line is mostly a ceramic phase in the photodefinable glass. In another aspect, the RF transmission line has mechanical and thermal stabilization structure is under less than 1% of the contact area of the RF transmission line structure where the contact area of the support pedestal and transmission line is mostly a ceramic phase in the photodefinable glass. The region not in contact with the substrate is either air or a vacuum. Where the transmission line to communicate data or form a filter.

The wafer is then annealed under an inert gas (e.g., Argon) at temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The wafer is then coated with between 200 Å and 10,000 Å thick of titanium and 200 Å and 10,000 Å thick of copper using CVD. The wafer is then coated with photoresist and expose to the interdigitated resonate and ground plane pattern. The wafer with the interdigitated transmission line resonate pattern and ground plane (front and backside metallization connected by through glass via) and electrical contact pads are patterned in the photoresist. The wafer is then placed into a copper electroplating bath where cooper is deposited at a thickness between 0.5 μm and 20 μm, preferably 10 microns. The photoresist is then removed leaving the cooper coated titanium interdigitated transmission line resonate structure and ground plane and any unwanted remaining seed layer is removed using any number of well-established techniques.

The ceramic portion of the exposed/converted glass is then etched away using 10% HF solution leaving the interdigitated, ground plane and input and output structures. The wafer is then rinsed and dried using DI water and IPA.

The present inventors used a photo-definable glass ceramic (APEX®) Glass Ceramic or other photo definable glass as a novel substrate material for semiconductors, RF electronics, microwave electronics, electronic components and/or optical elements. In general, a photodefinable glass is processed using first generation semiconductor equipment in a simple three step process and the final material can be fashioned into either glass, ceramic, or contain regions of both glass and ceramic. A transmission line structures enable a wide number of filters, e.g.: Bandpass, shunt Notch, Low Pass, and High Pass used in RF circuits at frequencies from MHz to THz devices while reducing the size, cost and power consumption.

Figure 14:
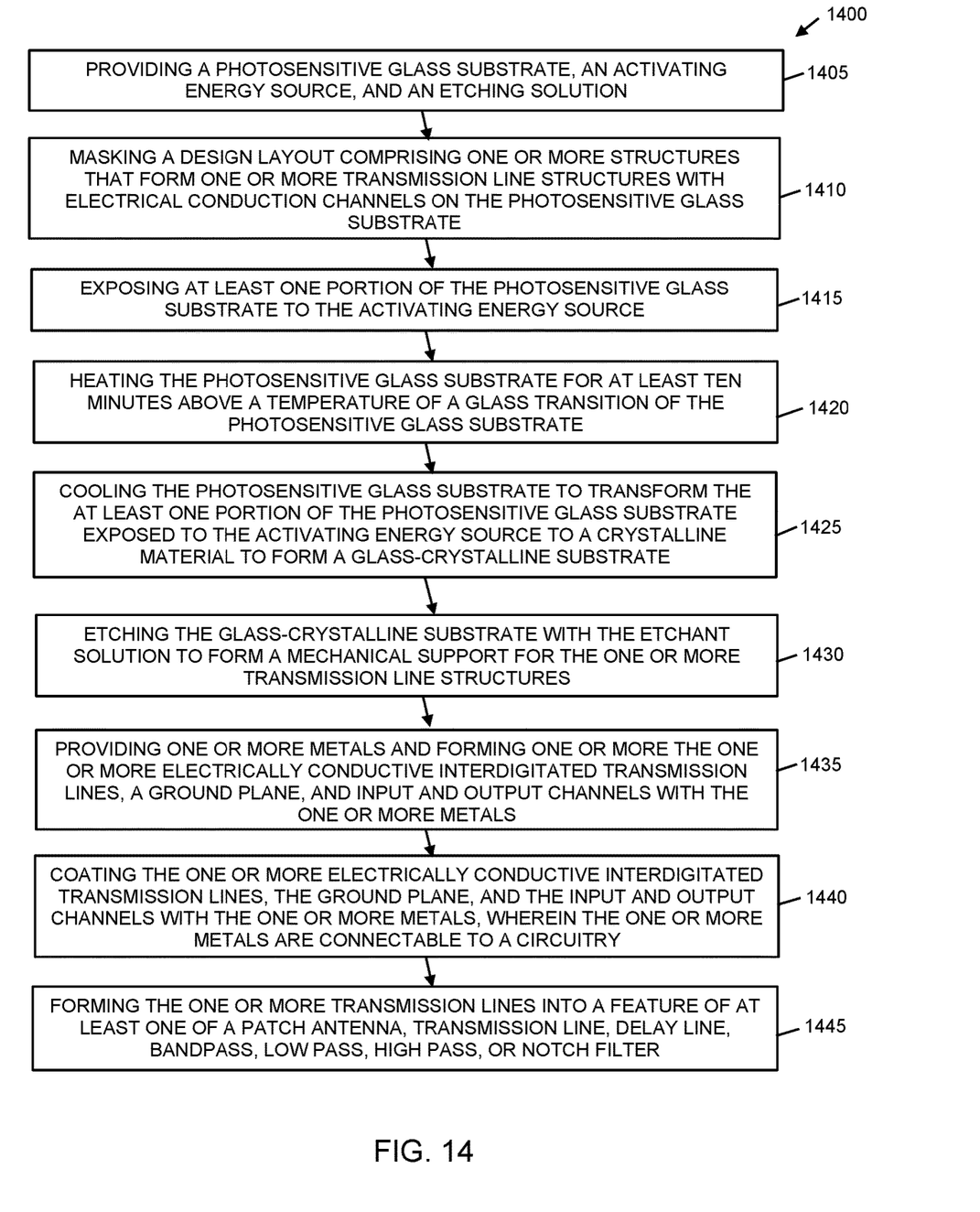
FIG. 14 is a flowchart of a method of making a mechanically stabilized radio frequency (RF) transmission line device.

The method 1400 of making a mechanically stabilized radio frequency (RF) transmission line device includes at least steps 1405-1445. Step 1405 includes providing a photosensitive glass substrate, an activating energy source, and an etching solution. Step 1410 masking a design layout comprising one or more structures that form one or more transmission line structures with electrical conduction channels on the photosensitive glass substrate. Exposing at least one portion of the photosensitive glass substrate to the activating energy source is included in step 1415. Step 1420 includes heating the photosensitive glass substrate for at least ten minutes above its glass transition a temperature of a glass transition of the photosensitive glass substrate. Cooling the photosensitive glass substrate to transform the at least one portion of the photosensitive glass substrate exposed to the activating energy source to a crystalline material to form a glass-crystalline substrate is included in step 1425. Step 1430 includes etching the glass-crystalline substrate with the etchant solution to form a mechanical support for the one or more transmission line structures. Step 1435 includes providing one or more metals and forming one or more the one or more electrically conductive interdigitated transmission lines, a ground plane, and input and output channels with the one or more metals. coating the one or more electrically conductive interdigitated transmission lines, the ground plane, and the input and output channels with the one or more metals, wherein the one or more metals are connectable to a circuitry is included in step 1440. Step 1445 includes forming the one or more transmission lines into a feature of at least one of a patch antenna, transmission line, delay line, bandpass, low pass, high pass, or notch filter.

Figure 13:
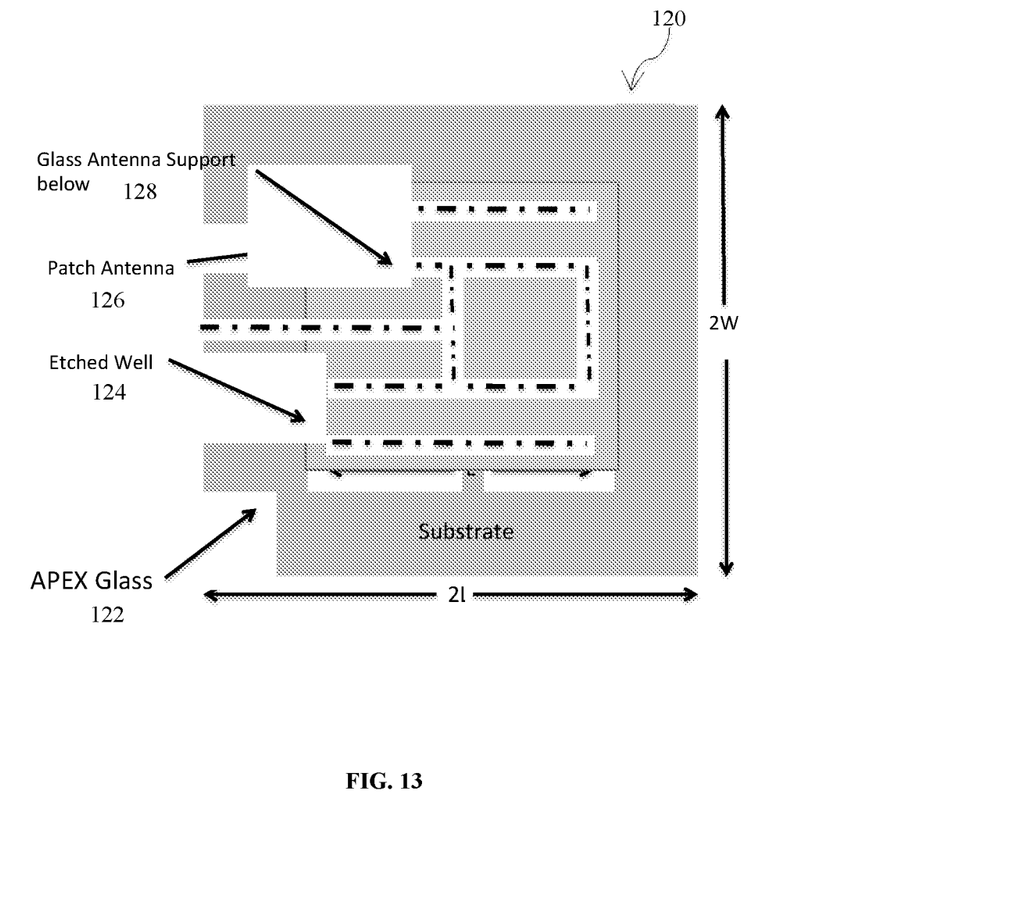
FIG. 13 shows a patch antenna made using the present invention.

FIG. 13 shows a patch antenna structure 120 made using the present invention. An APEX® glass substrate 122 includes an etched well 124, and a patch antenna 126 having a width W and a length L over the etched well 124. Often, the glass substrate 122 will have a length 2xL, and a width 2xL, or they may be varied based on the specifications of the device. The dotted lines indicate the glass mechanical support 128 under the patch antenna 126. The glass mechanical support 128 can be a pedestal or other structure that is formed by etching away the glass in the etched well 124, thus creating the glass mechanical support 128. The glass mechanical support 128 can be such that it includes the area within the dotted lines, or can also be the dotted lines itself, or combinations thereof, such that the glass mechanical support 128 supports anywhere from, e.g., 5, 10, 15, 20, 30, 45, 50, 60, 70, 75, 80, 90, or 100% of the area under the patch antenna 126. The skilled artisan, following the teachings of the present invention, can manipulate the electromagnetic features or characteristics of the patch antenna, as will be known to the skilled artisan. For example, when the patch antenna is used as an RF transmission line device, it can be designed to have a loss of less than 50, 40, 30, 25, 20, 15, or 10% of the signal input versus a signal output.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

What is claimed is:

1. A method of making a mechanically stabilized radio frequency (RF) transmission line device comprising:
   providing a photosensitive glass substrate, an activating energy source, and an etching solution;
   masking a design layout comprising one or more structures that form one or more transmission line structures with electrical conduction channels on the photosensitive glass substrate;
   exposing at least one portion of the photosensitive glass substrate to the activating energy source;
   heating the photosensitive glass substrate for at least ten minutes above a temperature of a glass transition of the photosensitive glass substrate;
   cooling the photosensitive glass substrate to transform the at least one portion of the photosensitive glass substrate exposed to the activating energy source to a crystalline material to form a glass-crystalline substrate;
   etching the glass-crystalline substrate with the etchant solution to form a mechanical support for the one or more transmission line structures;
   providing one or more metals and forming one or more electrically conductive interdigitated transmission lines, a ground plane, and input and output channels with the one or more metals; and coating the one or more electrically conductive interdigitated transmission lines, the ground plane, and the input and output channels with the one or more metals, wherein the one or more metals are connectable to a circuitry.

2. The method of claim 1, further comprising forming the one or more transmission lines into a feature of at least one of a patch antenna, transmission line, delay line, bandpass, low pass, high pass, or notch filter.

3. The method of claim 1, further comprising covering all or part of at least one of the one or more transmission lines, the ground plane, or the input and output channels with a coating or a lid.

4. The method of claim 1, wherein the mechanical support is a low loss tangent mechanical and thermal stabilization structure under the one or more transmission lines that is less than or equal to 100%, 50%, 10%, or 1% of a contact area of the one or more transmission lines.

5. The method of claim 1, wherein the etching step forms the mechanical support to comprise a support pedestal with an integrated ceramic core with glass cladding.

6. The method of claim 5, wherein the support pedestal has a glass cladding that is less than 40%, 20%, 10%, or 5% of a volume of the pedestal.

7. The method of claim 1, wherein the providing and coating steps comprise using the one or more metals, wherein the one or more metals comprise at least one of: titanium, titanium-tungsten, chrome, copper, nickel, gold, palladium or silver.

8. The method of claim 1, wherein the step of etching forms an air gap between the substrate and one or more transmission lines that are connectable to one or more RF electronic elements.

9. The method of claim 1, wherein the etching step comprises etching the glass-crystalline substrate to form one or more trenches adjacent to the mechanical support.

10. The method of claim 1, wherein the one or more metals are connectable to the circuitry through a surface, a buried contact, a blind via, a glass via, a straight-line contact, a rectangular contact, a polygonal contact, or a circular contact.

11. The method of claim 1, wherein the masking, exposing, heating, and cooling steps use a photosensitive glass substrate comprising a composition of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % Cu2O; 0.75 weight %-7 weight % $B_2O_3$, and 6-7 weight % $Al_2O_3$; and $Al_2O_3$ not exceeding 13 weight %; 8-15 weight % $Li_2O$; and 0.001-0.1 weight % $CeO_2$.

12. The method of claim 1, wherein the masking, exposing, heating, and cooling steps use a photosensitive glass substrate comprising a composition of: 35-76 weight % silica, 3-16 weight % $K_2O$, 0.003-1 weight % $Ag_2O$, 8-15 weight % $Li_2O$, and 0.001-0.1 weight % $CeO_2$.

13. The method of claim 1, wherein the masking, exposing, heating, and cooling steps use a photosensitive glass substrate that is at least one of: a photo-definable glass substrate that comprises at least 0.1 weight % $Sb_2O_3$ or $As_2O_3$; a photo-definable glass substrate that comprises 0.003-1 weight % $Au_2O$; a photo-definable glass substrate that comprises 1-18 weight % of an oxide selected from the group consisting of CaO, ZnO, PbO, MgO, SrO and BaO; and optionally has an anisotropic-etch ratio of an exposed portion to an unexposed portion that is at least one of 10-20:1; 21-29:1; 30-45:1; 20-40:1; 41-45:1; and 30-50:1.

14. The method of claim 1, wherein the masking, exposing, heating, and cooling steps use a photosensitive glass substrate that is a photosensitive glass ceramic composite substrate comprising at least one of silica, lithium oxide, aluminum oxide, or cerium oxide.

15. The method of claim 1, wherein the forming and coating steps configure the one or more transmission lines to have a loss of less than 50, 40, 30, 25, 20, 15, or 10% of a signal input versus a signal output.

16. The method of claim 1, wherein the forming and coating steps configure the one or more transmission lines to have a loss of less than 0.4 dB/cm at 30 Ghz.

17. The method of claim 1, wherein the etching, forming and coating steps configure the one or more transmission lines to have mechanical support under less than 10%, 5% or 1% of a contact area of the one or more transmission lines.

* * * * *